(12) United States Patent
Kim et al.

(10) Patent No.: US 9,355,902 B2
(45) Date of Patent: May 31, 2016

(54) METHOD OF FABRICATING SEMICONDUCTOR APPARATUS WITH THROUGH-SILICON VIA AND METHOD OF FABRICATING STACK PACKAGE INCLUDING THE SEMICONDUCTOR CHIP

(71) Applicant: SK hynix Inc., Icheon-si Gyeonggi-do (KR)

(72) Inventors: Chul Kim, Icheon-si (KR); Jong Chern Lee, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 5 days.

(21) Appl. No.: 14/459,520

(22) Filed: Aug. 14, 2014

(65) Prior Publication Data

US 2014/0357074 A1 Dec. 4, 2014

Related U.S. Application Data

(62) Division of application No. 13/604,449, filed on Sep. 5, 2012, now Pat. No. 8,823,181.

(30) Foreign Application Priority Data

Dec. 29, 2011 (KR) .................. 10-2011-0146442

(51) Int. Cl.
*H01L 21/44* (2006.01)
*H01L 21/48* (2006.01)
*H01L 21/50* (2006.01)
*H01L 21/4763* (2006.01)
(Continued)

(52) U.S. Cl.
CPC .... *H01L 21/76885* (2013.01); *H01L 21/76877* (2013.01); *H01L 21/76898* (2013.01); *H01L 23/481* (2013.01); *H01L 23/49811* (2013.01); *H01L 24/05* (2013.01); *H01L 24/06* (2013.01); *H01L 25/0657* (2013.01); *H01L 24/03* (2013.01); *H01L 24/13* (2013.01); *H01L 24/16* (2013.01); *H01L 2224/0361* (2013.01); *H01L 2224/0401* (2013.01); *H01L 2224/05009* (2013.01); *H01L 2224/0557* (2013.01); *H01L 2224/05556* (2013.01); *H01L 2224/05557* (2013.01); *H01L 2224/05568* (2013.01); *H01L 2224/05647* (2013.01); *H01L 2224/06181* (2013.01); *H01L 2224/131* (2013.01); *H01L 2224/13025* (2013.01); *H01L 2224/16145* (2013.01); *H01L 2224/16146* (2013.01); *H01L 2225/06513* (2013.01); *H01L 2225/06541* (2013.01); *H01L 2924/00014* (2013.01); *H01L 2924/10253* (2013.01); *H01L 2924/37001* (2013.01)

(58) Field of Classification Search
CPC ............. H01L 23/49811; H01L 25/0657; H01L 24/06; H01L 21/76898; H01L 23/481; H01L 2224/16; H01L 2924/15311; H01L 21/76802; H01L 21/76843; H01L 21/76831; H01L 21/76897
USPC ............. 438/108, 109, 637, 639, 667, 672
See application file for complete search history.

(56) References Cited

U.S. PATENT DOCUMENTS

2011/0121462 A1* 5/2011 Kim ........................... 257/774

*Primary Examiner* — A. Sefer
*Assistant Examiner* — Dilinh Nguyen
(74) *Attorney, Agent, or Firm* — William Park & Associates Ltd.

(57) ABSTRACT

In a semiconductor apparatus, a plurality of semiconductor chips including through-silicon vias are stacked in a vertical direction, wherein the through-silicon via formed in each semiconductor chip protrudes beyond heights of each semiconductor chip.

12 Claims, 5 Drawing Sheets

(51) Int. Cl.
*H01L 21/768* (2006.01)
*H01L 23/498* (2006.01)
*H01L 25/065* (2006.01)
*H01L 23/48* (2006.01)
*H01L 23/00* (2006.01)

METHOD OF FABRICATING SEMICONDUCTOR APPARATUS WITH THROUGH-SILICON VIA AND METHOD OF FABRICATING STACK PACKAGE INCLUDING THE SEMICONDUCTOR CHIP

CROSS-REFERENCES TO RELATED APPLICATION

The present application claims priority under 35 U.S.C. §119(a) to Korean application number 10-2011-0146442, filed on Dec. 29, 2011, in the Korean Intellectual Property Office, which is incorporated herein by reference in its entirety as set forth in full.

BACKGROUND

1. Technical Field

The present invention relates to a semiconductor apparatus, and more particularly, to a semiconductor apparatus including a plurality of stacked semiconductor chips and a method of fabricating is the same.

2. Related Art

In general, with the high integration of a semiconductor product, there has been proposed a semiconductor apparatus having a structure in which a plurality of semiconductor chips are three-dimensionally stacked.

According to the semiconductor apparatus having the stack structure, since the semiconductor chips are stacked through a simple process, it is possible to improve the performance of the semiconductor apparatus, reduce fabrication cost, and facilitate mass production. However, as the number of semiconductor chips stacked is increased and the size is increased, interconnection space for electrical connections in the semiconductor apparatus is not sufficient.

In this regard, as an example of a stack package, a structure using a through-silicon via has been proposed.

In a semiconductor apparatus using the through-silicon via, through-silicon vias are formed in a plurality of semiconductor chips, and the semiconductor chips are physically and electrically stack-connected using the through-silicon vias.

In the general semiconductor apparatus using the through-silicon via, the semiconductor chips may be connected to one another as follows.

FIG. 1 is a diagram illustrating a part of a general semiconductor apparatus using a through-silicon via.

Referring to FIG. 1, the general semiconductor apparatus is using a through-silicon via includes a first semiconductor chip 110 in which a through-silicon via 111 and a first bump 113 have been formed, a second semiconductor chip 130 in which a through-silicon via 131 and a second bump 133 have been formed, and a connection unit 120 formed of a conductive material, such as a solder ball 121, for electrically connecting the first semiconductor chip 110 to the second semiconductor chip 130.

In the general semiconductor apparatus using the through-silicon via, the through-silicon via 111 of the first semiconductor chip 110, the first bump 113, the solder ball 121, and the second bump 133 are connected to one another. Reference numerals 112, 123 (not mentioned), and 132 denote insulation layers.

However, in the general semiconductor apparatus using the through-silicon via, a bonding defect may occur in a bonding surface between a bump 122 of the connection unit 120 and the through-silicon via 131 of the second semiconductor chip 130 due to stresses (for example, temperature or pressure) generated in a semiconductor chip stack process.

SUMMARY

A semiconductor apparatus and a method of fabricating the same, capable of improving a yield by modifying a bonding surface of a semiconductor chip in a stack structure of a plurality of semiconductor chips to reduce a defect of a semiconductor apparatus, are described herein.

In one embodiment of the present invention, a semiconductor apparatus includes a plurality of semiconductor chips including through-silicon vias stacked in a vertical direction, wherein a the through-silicon via formed in each semiconductor chip protrudes beyond heights of each semiconductor chip.

In one embodiment of the present invention, a semiconductor apparatus includes: a first semiconductor chip including a first through-silicon via; a second semiconductor chip including a second through-silicon via; and a conductive connection member interposed between the first semiconductor chip and the second semiconductor chip in order to stack the first semiconductor chip and the second semiconductor chip, wherein the first semiconductor chip and the second semiconductor chip are formed with concave-convex sections, respectively.

In one embodiment of the present invention, a semiconductor apparatus includes: a first semiconductor chip including a first through-silicon via; a second semiconductor chip including a second through-silicon via; and a conductive connection member interposed between the first semiconductor chip and the second semiconductor chip in order to stack the first semiconductor chip and the second semiconductor chip, wherein the first through-silicon via and the second through-silicon via protrude on a basis of heights of the first semiconductor chip and the second semiconductor chip, respectively.

In one embodiment of the present invention, a method of is fabricating a semiconductor apparatus includes the steps of: forming a first semiconductor chip including a first through-silicon via; forming a second semiconductor chip including a second through-silicon via; and forming a conductive connection member between the first semiconductor chip and the second semiconductor chip such that the first semiconductor chip and the second semiconductor chip are stacked in a vertical direction, wherein the first through-silicon via and the second through-silicon via protrude beyond heights of the first semiconductor chip and the second semiconductor chip, respectively.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a method of is fabricating the same according to the present invention will be described in detail with reference to the accompanying drawings through various embodiments.

Figure 1:
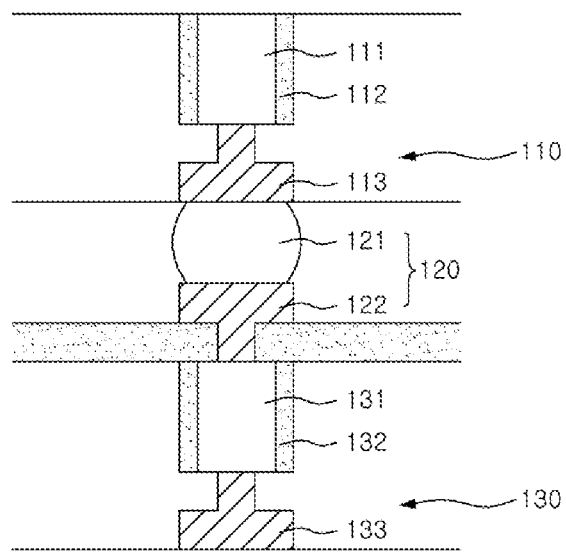
FIG. 1 is a diagram illustrating a part of a general semiconductor apparatus using a through-silicon via.
Figure 2:
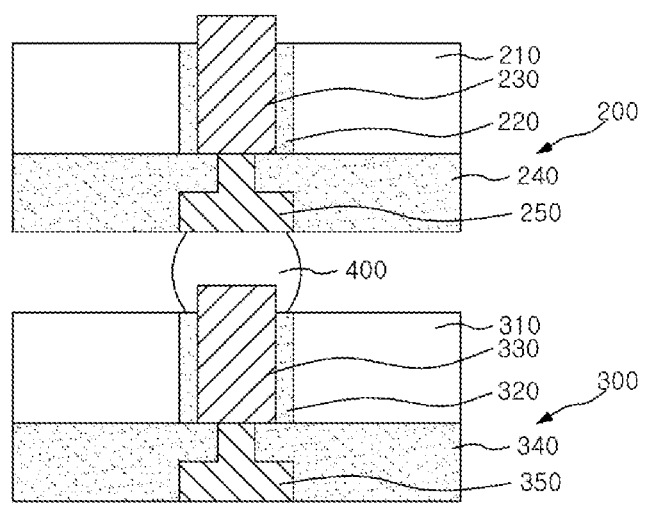
FIG. 2 is a diagram illustrating a part of a semiconductor apparatus using a through-silicon via according to an embodiment.

FIG. 2 is a diagram illustrating a part of a semiconductor apparatus according to an embodiment.

Referring to FIG. 2, a semiconductor apparatus according to the embodiment includes a first semiconductor chip 200, a second semiconductor chip 300, and a conductive connection member 400 for connecting the first semiconductor chip 200 to the second semiconductor chip 300.

Figure 11:
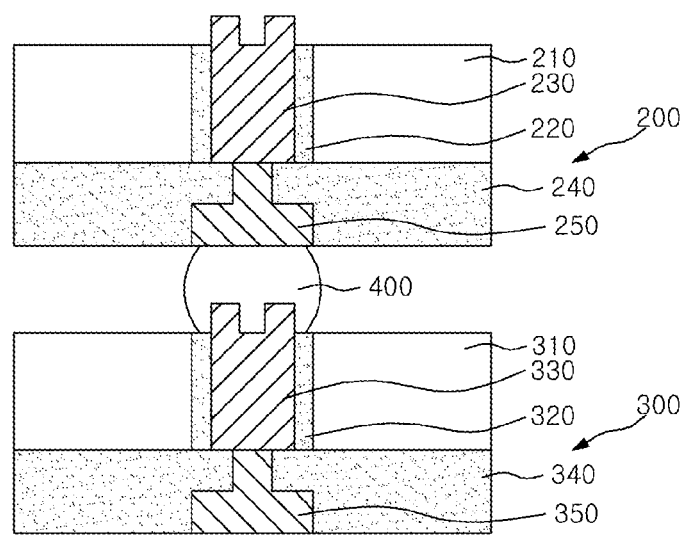
FIG. 11 is a diagram illustrating a part of a semiconductor apparatus according to another embodiment.

The first semiconductor chip 200 includes a first through-silicon via 230 for an electrical connection to another semiconductor chip (not illustrated) stacked on a first semiconductor substrate 210, an insulation layer 220 formed at both sides of the first through-silicon via 230 to insulate the first through-silicon via 230, and a first bump 250 for an electrical connection to the first through-silicon via 230. The first semiconductor chip 200 is formed such that the first through-silicon via 230 protrudes beyond the insulation layer 220. That is, the first semiconductor chip 200 has a convex section because the height of the first through-silicon via 230 is higher than the height of the first semiconductor chip 200. However, the first through-silicon via 230 may be formed to have a concave shape as illustrated in FIG. 11. Here, the first through-silicon via 230 may be formed of a copper (Cu) layer, and a reference numeral 240 denotes an insulation layer, wherein the insulation layer 240 may be formed is of oxide.

The second semiconductor chip 300 includes a second through-silicon via 330 for an electrical connection to the first semiconductor chip 200, an insulation layer 320 formed at both sides of the second through-silicon via 330 to insulate the second through-silicon via 330, and a second bump 350 for electrically connecting to the second through-silicon via 330 to a semiconductor chip (not illustrated) subsequently stacked. The insulation layer 320 may be formed of oxide. Similarly to the first semiconductor chip 200, the second through-silicon via 330 formed in second semiconductor chip 300 protrudes beyond the insulation layer 320. That is, similarly to the first semiconductor chip 200, the second semiconductor chip 300 has a convex section because the height of the second through-silicon via 330 is higher than the height of the second semiconductor chip 300. However, the second through-silicon via 330 may be formed to have a concave shape as illustrated in FIG. 11. Here, a reference numeral 340 denotes an insulation layer, wherein the insulation layer 340 may be formed of oxide.

The conductive connection member 400 is for connecting the first semiconductor chip 200 to the second semiconductor chip 300 in a flip-chip manner, and denotes a kind of solder ball. The conductive connection member 400 is formed to surround a part of the second through-silicon via 330 protruding from the second semiconductor chip 300.

In the semiconductor apparatus according to the embodiment as described above, a metal line provided in each semiconductor chip is not illustrated. However, it should be noted that the metal line is provided between the through-silicon via and the bump of each semiconductor chip.

Unlike the conventional art, in the semiconductor apparatus according to the embodiment as described above, the first semiconductor chip 200 is connected to the second semiconductor chip 300 using only the conductive connection member 400, so that a defect is substantially prevented from occurring in a bonding surface between semiconductor chips, that is, a bonding surface between a bump and a through-silicon via in the conventional art, resulting in an increase in the yield of the semiconductor apparatus.

Furthermore, since the first semiconductor chip 200 is connected to the second semiconductor chip 300 using only the conductive connection member 400, a connection defect between the semiconductor chip and the conductive connection member is substantially prevented by allowing the through-silicon via to protrude beyond the semiconductor chip.

A fabricating method of the semiconductor apparatus according to the embodiment will be described below.

FIGS. 3 to 10 are diagrams illustrating a fabricating method of the semiconductor apparatus according to the embodiment.

Figure 3:
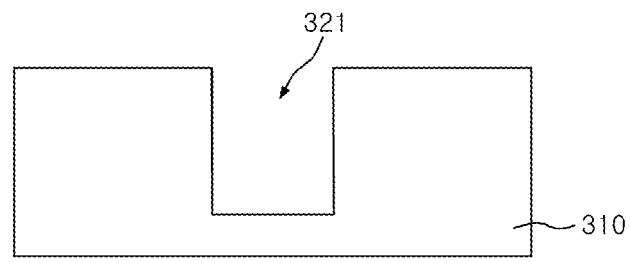
FIGS. 3 to 10 are diagrams illustrating a fabricating method of a semiconductor apparatus according to an embodiment.

As illustrated in FIG. 3, a hole 321 for forming a through-silicon via is formed in a silicon substrate 310 formed of silicon Si.

Figure 4:
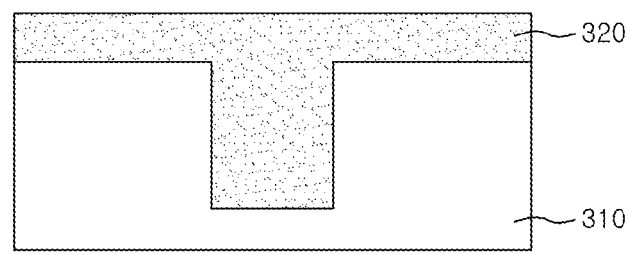

As illustrated in FIG. 4, a first insulation layer 320 is formed in the hole 321 and on the surface of the silicon substrate 310.

Figure 5:
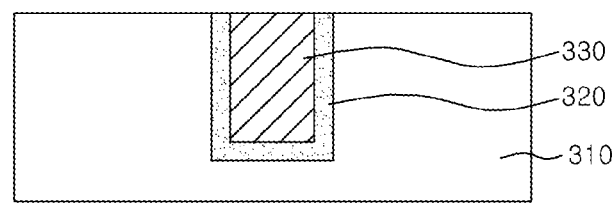

As illustrated in FIG. 5, the first insulation layer 320 is etched such that the first insulation layer 320 is filled only at both sidewalls and the bottom of the hole 321, and a conductive metal is filled in the hole 321 to form a through-silicon via 330. The through-silicon via 330 may be formed by depositing a copper (Cu) layer, wherein the deposition of the copper (Cu) layer may be performed using an electroplating method.

Figure 6:
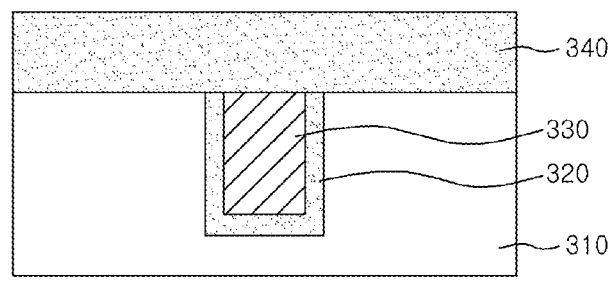

As illustrated in FIG. 6, a second insulation layer 340 is formed on the silicon substrate 310 including the through-silicon via 330.

Figure 7:
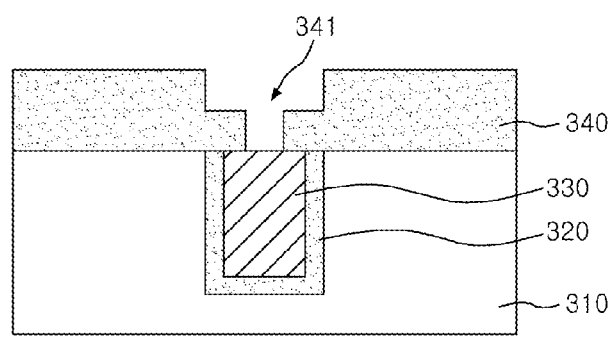

As illustrated in FIG. 7, in order to form a bump for signal exchange with another semiconductor chip to be stacked, the second insulation layer 340 is etched to form a bump hole 341. The bump hole 341 is etched such that the through-silicon via 330 is exposed. In the embodiment, the bump hole 341 is etched in a T shape or a 180°-rotated T shape. However, the present invention is not limited thereto. For example, the bump hole 341 may be formed to have a width narrower than that of the through-silicon via 330.

Figure 8:
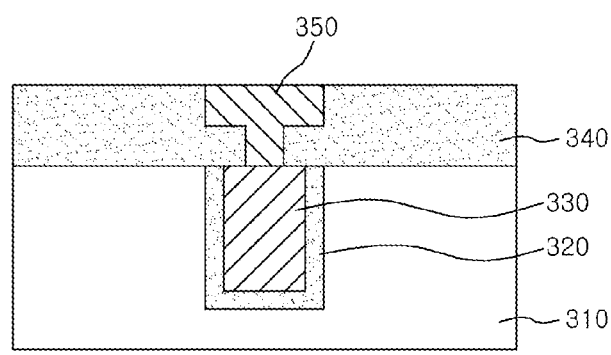

As illustrated in FIG. 8, a conductive metal is filled in the bump hole 341 such that a signal is transferred, so that a bump 350 is formed.

Figure 9:
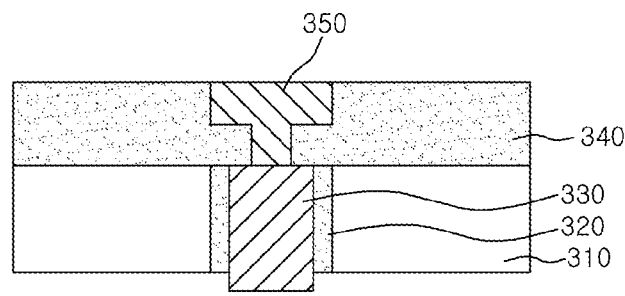

As illustrated in FIG. 9, the back surface of the silicon substrate 310 is back-grinded until the through-silicon via 330 is exposed. When the through-silicon via 330 is exposed, the silicon substrate 310 is further etched such that the through-silicon via 330 protrudes beyond the silicon substrate 310. This is for substantially preventing a connection defect which may occur between a conductive connection member for a connection to a subsequent semiconductor chip and the through-silicon via 330.

Figure 10:
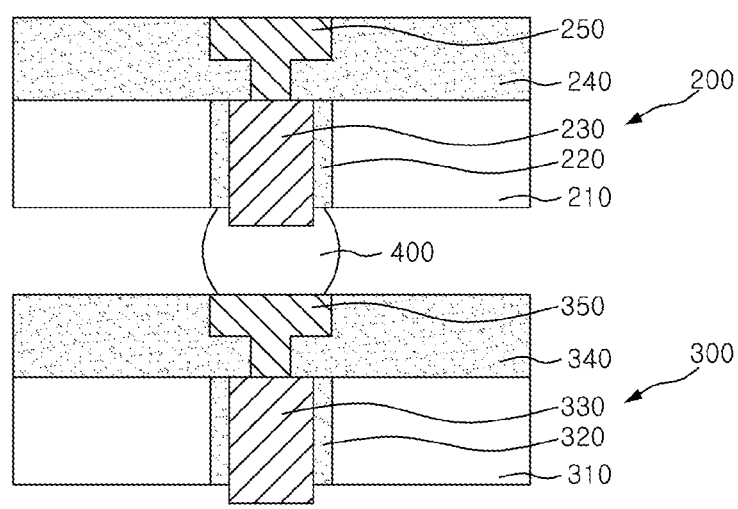

As illustrated in FIG. 10, in order to stack the first semiconductor chip 200 and the second semiconductor chip 300 completed as above, the conductive connection member 400 such as a solder ball is formed to surround the protruding through-silicon via 330, so that the semiconductor apparatus according to the embodiment is completed.

In the semiconductor apparatus and the fabricating method thereof according to the embodiment, from the conventional structure of the first bump—the conductive connection member 400 such as a solder ball—the second bump 350—the through-silicon via 330, the first bump is removed, and the conductive connection member 400 and the through-silicon via 230 or the second bump 350 are directly connected to each other, so that a connection defect between the bump and the through-silicon via 230 is solved, resulting in the improvement of the yield of the semiconductor apparatus.

Furthermore, in the semiconductor apparatus and the fabricating method thereof according to the embodiment, the through-silicon via 330 protrudes beyond the semiconductor chip 300, so that a connection defect, which may occur between the through-silicon via 330 and the conductive connection member 400, is substantially prevented, resulting in the improvement of the reliability of the semiconductor apparatus.

Furthermore, in the semiconductor apparatus and the fabricating method thereof according to the embodiment, from the conventional structure of the first bump—the conductive connection member 400 such as a solder ball—the second bump 350—the through-silicon via 330, the first bump is removed, so that a semiconductor fabrication process is simplified, resulting in a reduction of a fabrication cost of the semiconductor apparatus.

While certain embodiments have been described above, it will be understood to those skilled in the art that the embodiments described are by way of example only. Accordingly, the semiconductor apparatus and the method of fabricating the same described herein should not be limited based on the described embodiments. Rather, the semiconductor apparatus and the method of fabricating the same described herein should only be limited in light of the claims that follow when taken in conjunction with the above description and accompanying drawings.

What is claimed is:

1. A method of fabricating a semiconductor apparatus, comprising the steps of:
    forming a first semiconductor chip including a first through-silicon via, the first though-silicon via being protruded beyond heights of the first semiconductor chip;
    forming a first insulating layer having a first bump on the first semiconductor chip, wherein the first bump includes a first portion with a first line width and a second portion with a second line width being wider than the first line width, and the first through-silicon via is electrically contacted with the first portion of the bump;
    forming a second semiconductor chip including a second through-silicon via, the second though-silicon via being protruded beyond heights of the second semiconductor chip; and
    stacking the first semiconductor chip and the second semiconductor chip using a conductive connection member such that an upper surface of the conductive connection member is contacted to the second portion of the first bump and a bottom surface of the conductive connection member is contacted to a protruding portion of the second through-silicon via,
    wherein a diameter of the protruding portion is smaller than that of the conductive connection member.

2. The method according to claim 1, wherein each of the steps of forming the first semiconductor chip and the second semiconductor chip comprises:
    forming a semiconductor substrate formed with a hole;
    depositing a first insulation layer in the hole and on the semiconductor substrate;
    etching the first insulation layer such that the first insulation layer is filled only at sidewalls of the hole, and filling a conductive metal in the hole to form a through-silicon via;
    depositing a second insulation layer on an upper portion of the through-silicon via;
    etching the second insulation layer such that the through-silicon via is exposed, forming a bump hole, and filling a conductive metal in the bump hole to form a bump; and
    back-grinding a back surface of the semiconductor substrate such that the through-silicon via is exposed.

3. The method according to claim 1, wherein the first semiconductor chip includes a first surface and a second surface, the first through-silicon via is protruded from the first surface and the first insulating layer is formed on the second surface.

4. The method according to claim 1, further comprising:
    forming a second insulating layer having a second bump on the second semiconductor chip, wherein the second bump includes a third portion with a third line width and a fourth portion with a fourth line width being wider than that of the third line width.

5. The method according to claim 4, wherein the second semiconductor chip includes a third surface and a fourth surface, the second through-silicon via is protruded from the third surface and the second insulating layer is formed on the fourth surface.

6. The method according to claim 4, wherein the third line width of the second bump is narrower than a line width of the second through-silicon via.

7. The method according to claim 1, further comprising:
    forming concave portions on protruded surfaces of the first and second through-silicon vias, respectively.

8. The method according to claim 1, wherein the first line width of the first bump is narrower than a line width of the first through-silicon via.

9. A method of fabricating a stack package, comprising the steps of:
    providing a first semiconductor chip including a first surface and a second surface;
    forming a first through-silicon via in the first semiconductor chip to be protruded from the first surface of the first semiconductor chip;
    forming a first insulating layer with a first bump on the second surface of the first semiconductor chip, wherein the first bump includes a first portion with a first line width and a second portion with a second line width being wider than the first line width;
    providing a second semiconductor chip including a third surface and a fourth surface;
    forming a second through-silicon via in the second semiconductor chip to be protruded from the third surface of the second semiconductor chip;
    forming a second insulating layer with a second bump on the fourth surface of the second semiconductor chip, wherein the second bump includes a third portion with a third line width and a fourth portion with a fourth line width being wider than the third line width;
    vertically stacking the first semiconductor chip and the second semiconductor chip using a conductive connection member such that an upper surface of the conductive connection member is contacted to the second portion of the first bump and a bottom surface of the conductive connection member is contacted to a protruding portion of the second through-silicon via,
    wherein a diameter of the protruding portion is smaller than that of the conductive connection member.

10. The method according to claim 9, further comprising:
    forming concave portions on protruded surfaces of the first and second through-silicon vias, respectively.

11. The method according to claim 9, wherein the first line width of the first bump is narrower than a line width of the first through-silicon via.

12. The method according to claim 9, wherein the third line width of the second bump is narrower than a line width of the second through-silicon via.

* * * * *